(12) United States Patent
Parry et al.

(10) Patent No.: US 6,646,790 B2
(45) Date of Patent: Nov. 11, 2003

(54) OPTICAL AMPLIFIER GAIN CONTROL MONITORING

(75) Inventors: Simon P. Parry, Harlow (GB); Eric S. Maniloff, Kanata (CA); Gary Mak, Ottawa (CA); Andy Rowland, Kanata (CA); Franz H. Mok, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 79 days.

(21) Appl. No.: 10/058,879

(22) Filed: Jan. 28, 2002

(65) Prior Publication Data

US 2003/0142390 A1 Jul. 31, 2003

(51) Int. Cl.[7] ................................................. H01S 3/00
(52) U.S. Cl. .................................................. 359/337.11
(58) Field of Search ..................................... 359/337.11

(56) References Cited

U.S. PATENT DOCUMENTS 6,166,850 A * 12/2000 Roberts et al. .......... 359/341.2
6,411,417 B1 * 6/2002 Roberts et al. ............. 398/177

* cited by examiner

Primary Examiner—Thomas G. Black
Assistant Examiner—Deandra M. Hughes
(74) Attorney, Agent, or Firm—Pearne & Gordon LLP (57) ABSTRACT

In a method and apparatus for tracking dynamic characteristics of an optical amplifier, optical signal probes are used to determine the gain and the corner frequency of the optical amplifier. A first optical probe having a predetermined modulation frequency above an expected corner frequency of the amplifier is used to estimate the gain of the optical amplifier. A second optical probe signal having a second predetermined modulation frequency at or below the expected corner frequency of the amplifier is used to estimate the corner frequency. These parameters can be used to optimize gain control of an optical amplifier.

15 Claims, 6 Drawing Sheets

OPTICAL AMPLIFIER GAIN CONTROL MONITORING

CROSS-REFERENCE TO RELATED APPLICATIONS

This is the first application filed for the present invention.

MICROFICHE APPENDIX

Not Applicable.

TECHNICAL FIELD

The present invention relates to optical amplifiers and in particular to a method and system for controlling gain of an optical amplifier.

BACKGROUND OF THE INVENTION

In optical telecommunications, erbium doped fiber amplifiers (EDFA) are commonly used for efficient signal amplification of optical signals on fiber optic spans without requiring optical-to-electrical and electrical-to-optical signal conversion. EDFAs are especially efficient when multiple signal channels of different frequencies are present on a fiber. Traditionally, EDFA amplifiers are statically configured, with fairly stable signal channels on the fiber. Increasingly, however, signal channels on fibers are switched in and out to meet dynamic market demands. This requires EDFA amplifiers to be reconfigured to maintain consistent signal levels. A control system is thus required for actively controlling optical amplifiers under rapidly changing network conditions.

Amplifier control systems are known in which an optical probe signal is used to measure amplifier gain, which in turn, is used to adjust the pump power to keep the gain of the amplifier constant. As is well known in the art, control constants in the feedback loop determine the stability, sensitivity and transient response of the control system. Control constant values are normally selected to prevent the system from reacting too slowly, or oscillating in response to changes. Normally, optical amplifier control systems use fixed control constants that have been chosen to ensure unconditional system stability. However, this does not provide fast enough operation under certain conditions. The frequency response of an optical amplifier typically varies under different operating conditions. As the number of signal channels increases or decreases, and the amplifier pump power varies, the frequency response of the amplifier changes. This in turn, affects control system stability. It is therefore highly desirable to have an adaptive system that is tuned to the actual operating conditions of the optical amplifier.

One strategy that has been suggested is to use a look-up table of control constant values. This would store optimized control constant values for each of a range of operating conditions. This technique has the disadvantage of requiring an accurate look-up table that would have to be very large, because there are a wide variety of network conditions that affect the frequency response of the amplifier.

Another possible solution is to use an adaptive control system which adjusts the control constant values in response to it's own performance. This technique has the disadvantage of being complex to implement and sensitive to stability problems.

Accordingly, a cost effective system for actively tracking and controlling an EDFA amplifier remains highly desirable.

SUMMARY OF THE INVENTION

An object of the present invention is to provide a cost effective system for actively tracking and controlling an EDFA amplifier.

Accordingly, an aspect of the present invention provides a method of tracking dynamic characteristics of an optical amplifier. The method comprises estimating a gain of the amplifier using a first optical probe signal having a first predetermined modulation frequency above an expected corner frequency of the amplifier and estimating a corner frequency of the amplifier using a second optical probe signal having a second predetermined modulation frequency at or below the expected corner frequency of the amplifier.

Another aspect of the present invention provides a system for tracking dynamic characteristics of an optical amplifier, the apparatus comprising a gain estimating means for estimating a gain of the amplifier using a first optical probe signal having a first predetermined modulation frequency above an expected corner frequency of the amplifier and corner frequency estimating means for estimating a corner frequency of the amplifier using a second optical probe signal having a second predetermined modulation frequency at or below the expected corner frequency of the amplifier.

In embodiments of the invention, the gain at both the first frequency and second frequency may be measured by injecting an optical probe signal having a first power into an input of the optical amplifier, measuring an output power of the optical probe signal at an output of the optical amplifier and determining the gain from a difference between the output power and the input power of the optical probe signal.

In embodiments of the invention, the optical probe signal may be provided by a modulated broadband light source. This broadband light source may be a light emitting diode. The output power of the optical probe signal may be measured by a synchronous detector.

BRIEF DESCRIPTION OF THE DRAWINGS

Further features and advantages of the present invention will become apparent from the following detailed description, taken in combination with the appended drawings, in which.

DETAILED DESCRIPTION OF THE PREFERRED EMBODIMENT

The present invention provides a cost effective system for actively tracking and controlling an EDFA amplifier. In order to more fully understand the present invention, the following paragraphs provide a brief description conventional EDFA amplifiers with reference to FIGS. 1 and 2.

Figure 1:
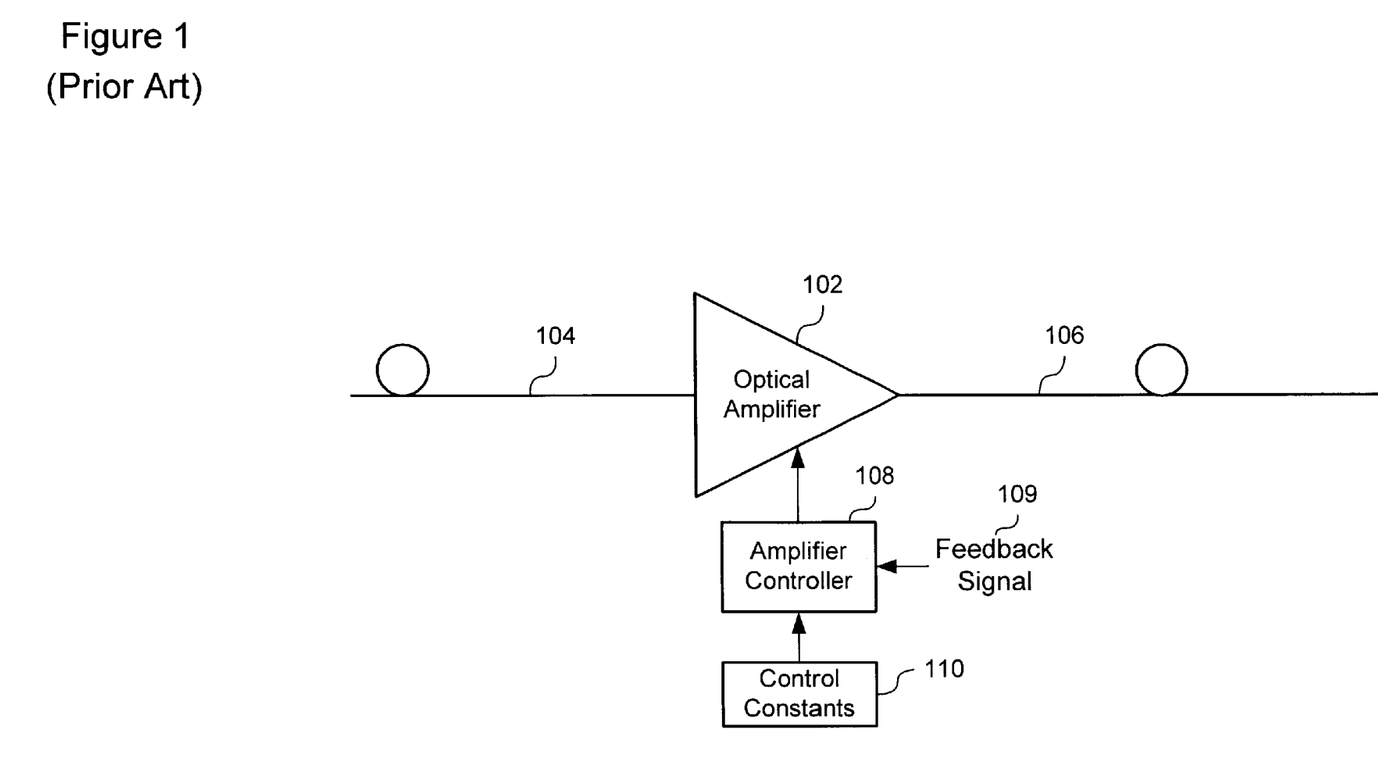
FIG. 1 is block diagram schematically illustrating principal elements of a conventional optical amplifier and amplifier controller.

As shown in FIG. 1, a conventional optical amplifier 102 receives optical data traffic from fiber 104. This traffic is optically amplified by the optical amplifier 102 and launched into optical fiber 106. The optical amplifier 102 is controlled by an amplifier controller 108 to maintain a constant gain. As is well known in the art, the amplifier controller 108 is operated to control the power of one or more pump lasers within the amplifier 102, using a feedback signal 109 and control constants 110. The feedback signal will normally be a measure of the amplifier performance, such as, for example, amplifier output power, amplifier gain, bit error rate measured at a down stream receiver, or other measured parameters. In conventional optical amplifier control systems, the control constants 110 are fixed, and are chosen to ensure unconditional system stability. However, this does not provide fast enough operation and/or satisfactory amplifier performance under certain conditions.

Figure 2:
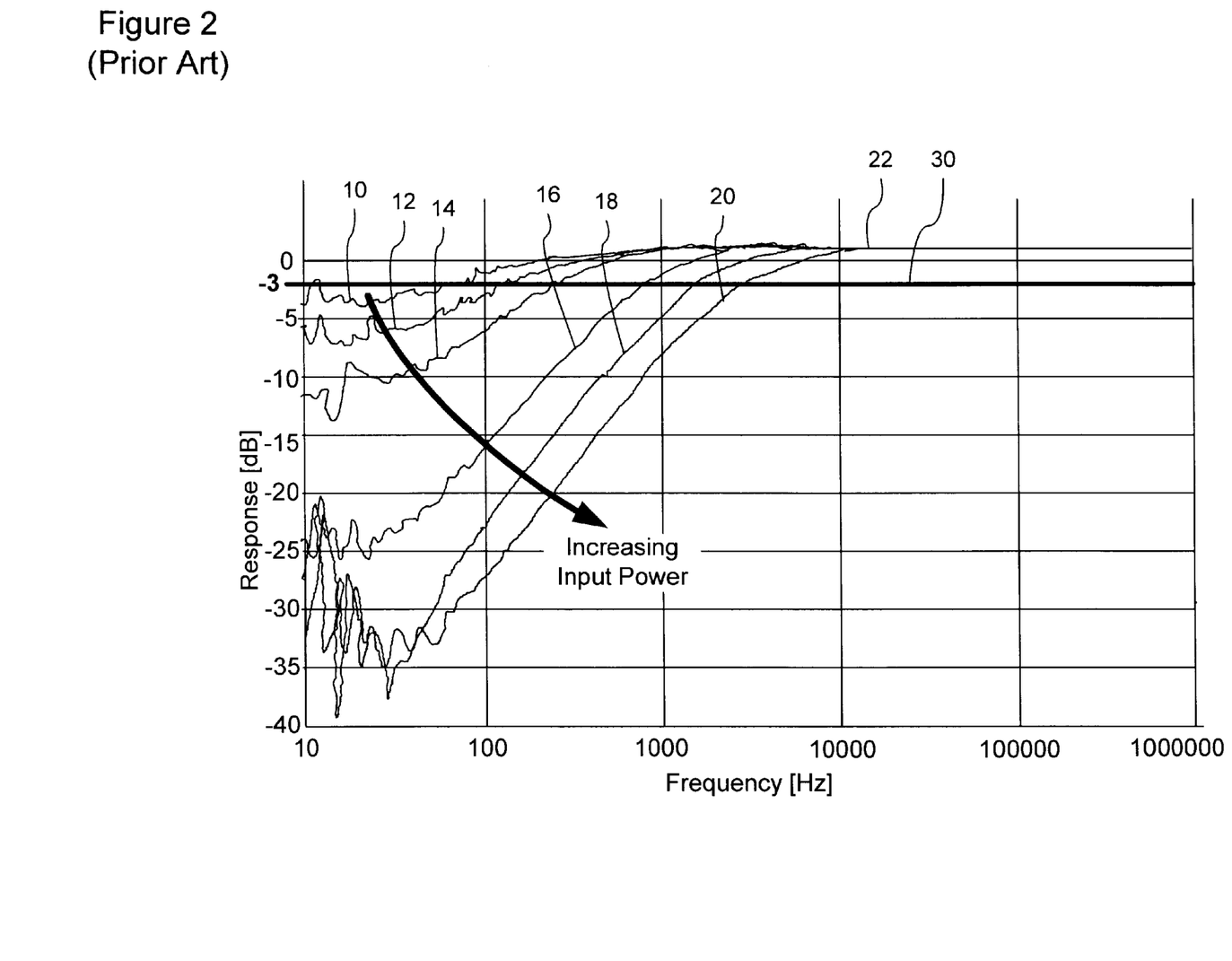
FIG. 2 illustrates an exemplary frequency response of an optical amplifier over a range of operating conditions.

The frequency response of an optical amplifier typically varies under different operating conditions. As the number of signal channels increases or decreases, and the amplifier pump power varies, the frequency response of the amplifier changes. FIG. 2 shows typical optical amplifier frequency response curves. The graph shows the modulation frequency of data signals on the horizontal axis and amplifier response as decibels of gain on the vertical axis. The curves 10, 12, 14, 16, 18, 20 show how the amplifier gain changes as a function of increasing input power (i.e. data traffic). In this example, curve 10 represents amplifier gain for an input power of −26.6 dBm and curve 20 represents amplifier gain for an input power of −8.4 dBm. As may be seen, all of the curves stabilize above approximately 10 kHz to a maximum value of optical amplifier gain. This maximum value is normalized in FIG. 2 at 0 dB response and is considered the nominal gain of the optical amplifier. A corner frequency of an optical amplifier is considered the frequency at which the response curve drops to 3 dB below the gain of the amplifier (shown at line 30 in FIG. 2). The corner frequency is a measure of the frequency response of the optical amplifier, and varies with the operating conditions. As such, the corner frequency is an indicator of the current operating conditions, which can be used to dynamically adjust the control constants used by the amplifier controller.

Figure 3:
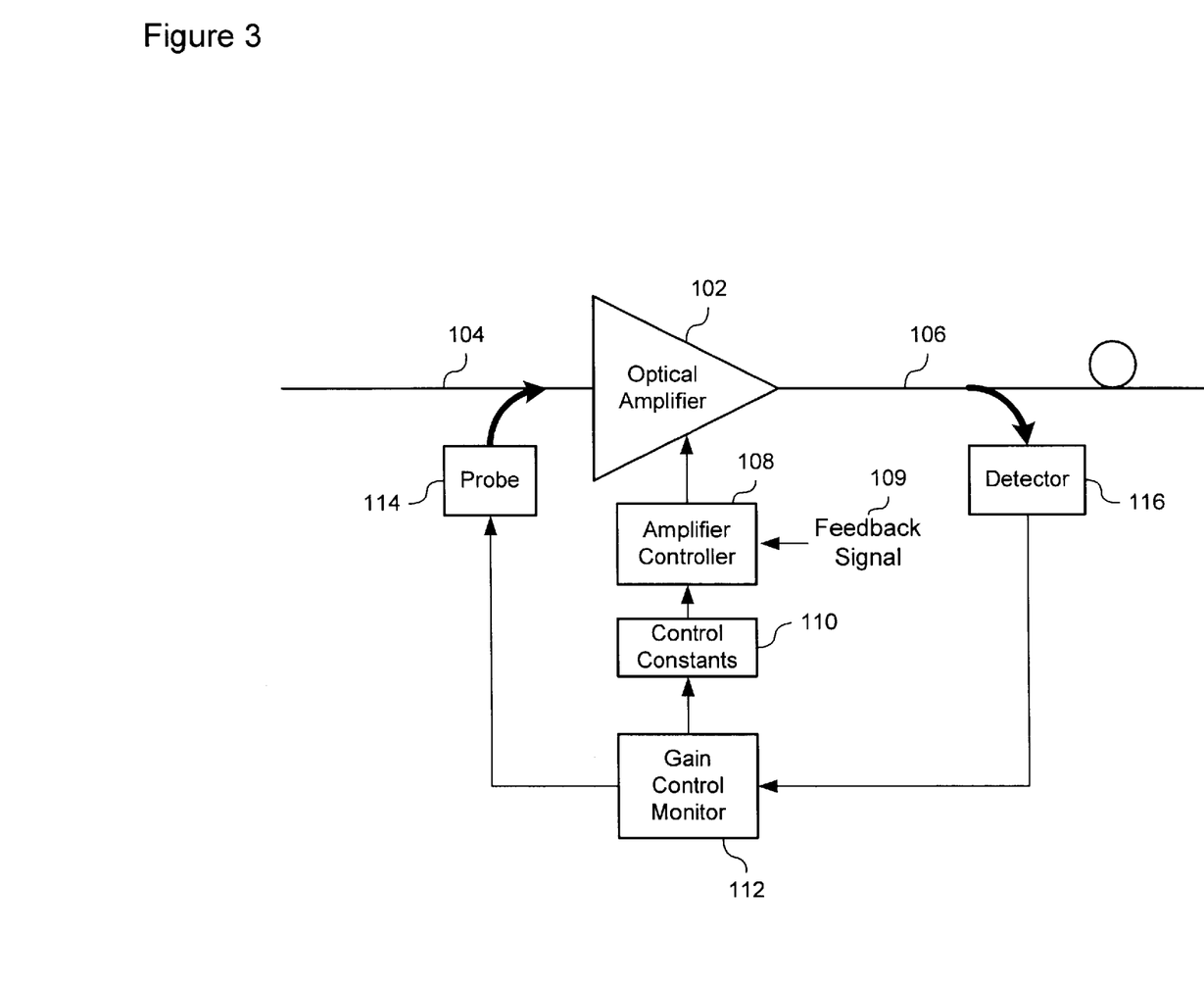
FIG. 3 is block diagram schematically illustrating principal elements of an exemplary embodiment of a system for controlling the gain of the optical amplifier of FIG. 1 in accordance with the present invention.

FIG. 3 is a block diagram schematically illustrating principle elements of an optical amplifier control system in accordance with the present invention. As may be seen in FIG. 3, the control system of the present invention includes an optical emitter 114, an optical detector 116, and a gain control monitor 112.

The optical emitter 114 is designed to generate a modulated optical probe signal, which is injected into an input port of the optical amplifier 102. The optical probe can be multiplexed into the input fiber 104 using a optical signal tap in a manner well known in the art. If desired, the emitter 114 can be provided as a narrowband light source such as a laser, in which case the wavelength of the laser must be "out-of-band" (that is, it must be selected to lie outside the range of wavelengths of the data traffic) so as not to cause interference. However, narrow band lasers tend to be expensive, and the need for "out-of-band" wavelengths can cause calibration issues.

Alternatively, it is possible to use the pump laser(s) of the amplifier itself as the emitter 114. This embodiments relies on the fact that cross-coupling of optical energy from the pump laser(s) to the data traffic occurs primarily at high frequencies. As a result, from the point of view of the pump laser(s), the amplifier operates as a low-pass filter, in which high frequencies are attenuated (by cross-coupling to data traffic) and low frequencies passed. It is therefore possible to impose a low frequency modulation on the pump laser(s), which can then be detected and used to estimate the amplifier gain. However, use of the pump laser(s) as the emitter 114 raises difficulties, in that residual pump energy arriving at downstream devices would have to be filtered to avoid causing interference.

Accordingly, the emitter 114 is preferably provided as a low cost broadband light source, such as, for example, a conventional light emitting diode (LED). In practice, one or more emitters 114 may be used. Each emitter may have the same or a different energy spectrum, as desired, and may be operated at different modulation frequencies and/or power levels. In use, the emitter is controlled to generate the probe signal with a selected modulation frequency (as will be described in greater detail blow) that is high enough to avoid disturbing the amplifier operating conditions, and yet low enough to avoid interference with data traffic. This can be achieved using modulation frequencies of between about 100 Hz and 100 kHz, which is well within the capability of low cost LEDs. The power level (both DC power and modulation power) of the probe signal should be low enough to avoid disturbing the amplifier response and which can readily be handled or ignored by down-stream receivers such that it does not significantly lower the signal-to-noise ratio.

The detector 116 is designed to detect the power level of the optical probe signal emerging from the optical amplifier 102. The detector 116 can receive the probe signal via an optical tap on fiber 106 in a manner well known in the art. In a preferred embodiment, the detector is a synchronous detector, which operates to detect the modulation power of the probe signal. This allows known signal processing techniques to be used to effectively separate the probe signal from noise (and/or data traffic) received by the detector 116.

The gain control monitor 112, which may be implemented as any suitable combination of hardware and/or software, is designed to control the emitter 114 to generate probe signals with selected modulation powers and frequencies, monitor the modulation power detected by the detector 116, and use this information to estimate amplifier gain and corner frequency using the known parameters of the probe signal generated by the emitter 114 and the modulation power detected by the detector 116. The estimated amplifier gain and corner frequency can be used to dynamically adjust the appropriate amplifier control constants 110, and thereby optimize the response and stability of the amplifier controller 108.

Based on a basic knowledge of the type of the optical amplifier, it is possible to determine (e.g. experimentally) a specific range of values within which the corner frequency of the amplifier will fall. It is therefore possible to assume an expected corner frequency value for the purposes of selecting probe frequencies. In addition, it is also possible to determine characteristic gain curves (again, experimentally).

As described above with reference to FIG. 2, such gain curves are relatively flat above the corner frequency, and display a roll-off below the corner frequency. Accordingly, amplifier gain can be estimated by controlling the emitter 114 to generate a probe signal having a modulation frequency well above an expected corner frequency of the amplifier. The corner frequency itself can estimated by controlling the emitter 114 to generate one or more probe signals having respective modulation frequencies below the expected corner frequency. Three alternative methods of estimating the corner frequency are described below with reference to FIGS. 4–6.

Figure 4:
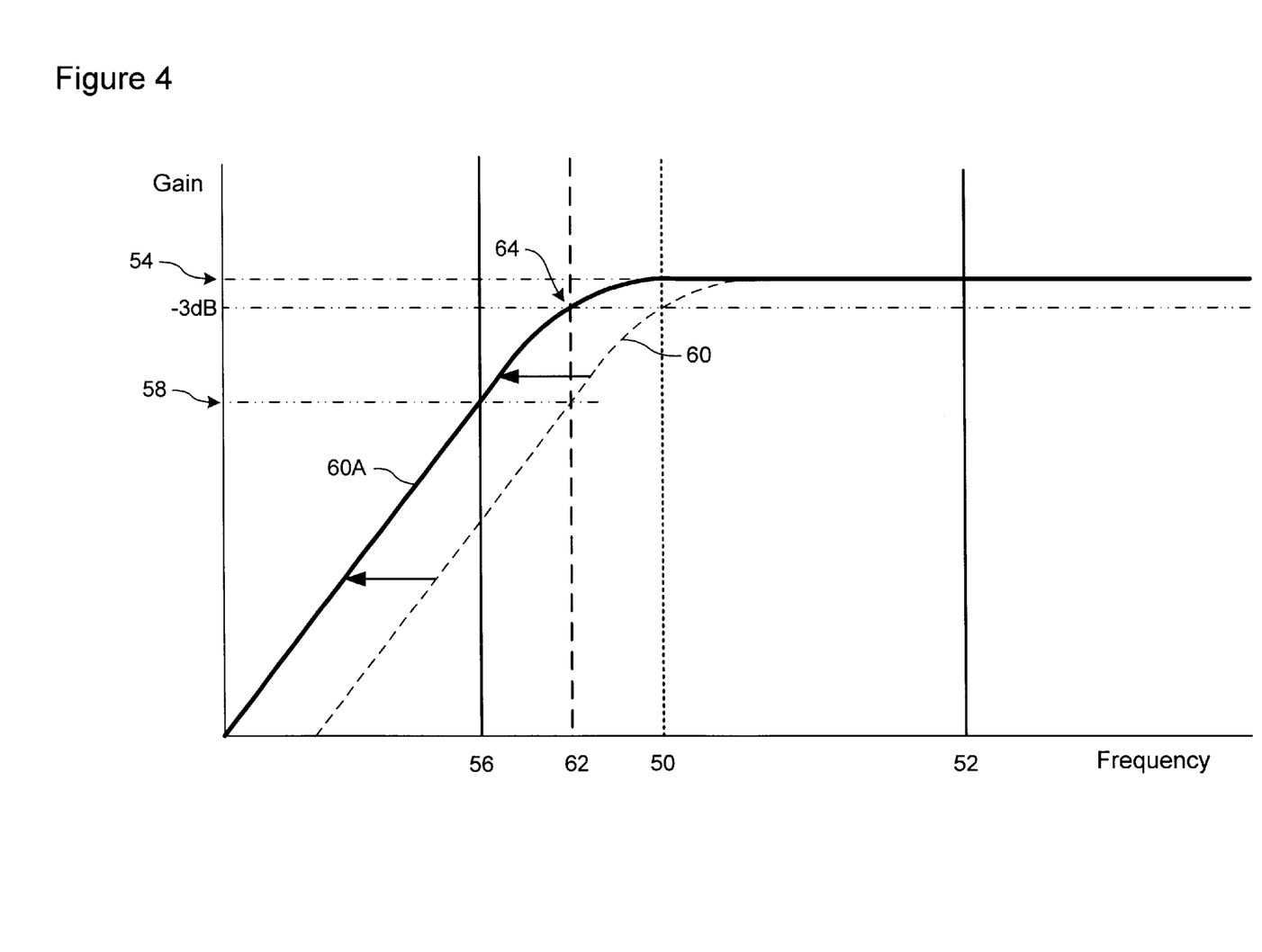
FIG. 4 illustrates a characteristic optical amplifier response curve in relation to probe signals used for tracking dynamic characteristics the amplifier in an exemplary embodiment of a method of the present invention.

FIG. 4 illustrates a method of estimating the corner frequency, which uses the shape of an expected characteristic gain curve of the amplifier. This embodiment relies the fact that, in most cases, a changes in the operating conditions of the amplifier causes a movement the characteristic gain curve (and thus a change in the corner frequency), but normally does not significantly affect the shape of the curve (at least near the corner frequency). Thus, an expected corner frequency of the optical amplifier is assumed at point 50. This value may, for example, represent an average value of the corner frequency over an expected range of operating conditions of the amplifier.

As described above, the nominal gain of the amplifier can be estimated by selecting a first modulation frequency 52 above the expected corner frequency 50. A first modulation frequency 52 of, for example, on the order of about 200kHz normally yields satisfactory results. The emitter 114 is then controlled to generate a respective first optical probe signal having the selected modulation frequency 52, and the modulation power detected by the detector 116 used to determined a first measured gain value shown at point 54. Due to the flatness of the gain curve above the corner frequency, this first measured gain value 54 can be used directly as the estimated nominal gain of the optical amplifier. By definition, the corner frequency will that frequency at which the amplifier gain is 3dB below this value.

In order to find the corner frequency, a second optical probe signal having a second modulation frequency 56 below the expected corner frequency 50, is used to return a second measured gain value (at 58). A modulation frequency 56 of, for example, on the order of about 200 Hz, normally yields satisfactory results. An expected characteristic gain curve 60 of the amplifier can then be aligned (or "matched") to the gain values measured at each of the first and second probe signal modulation frequencies, as shown by the arrows in FIG. 4, to yield curve 60A. The corner frequency 62 can then be determined directly from curve 60A, by calculating the frequency at which curve 60A falls 3dB below the estimated nominal gain of the amplifier.

Figure 5:
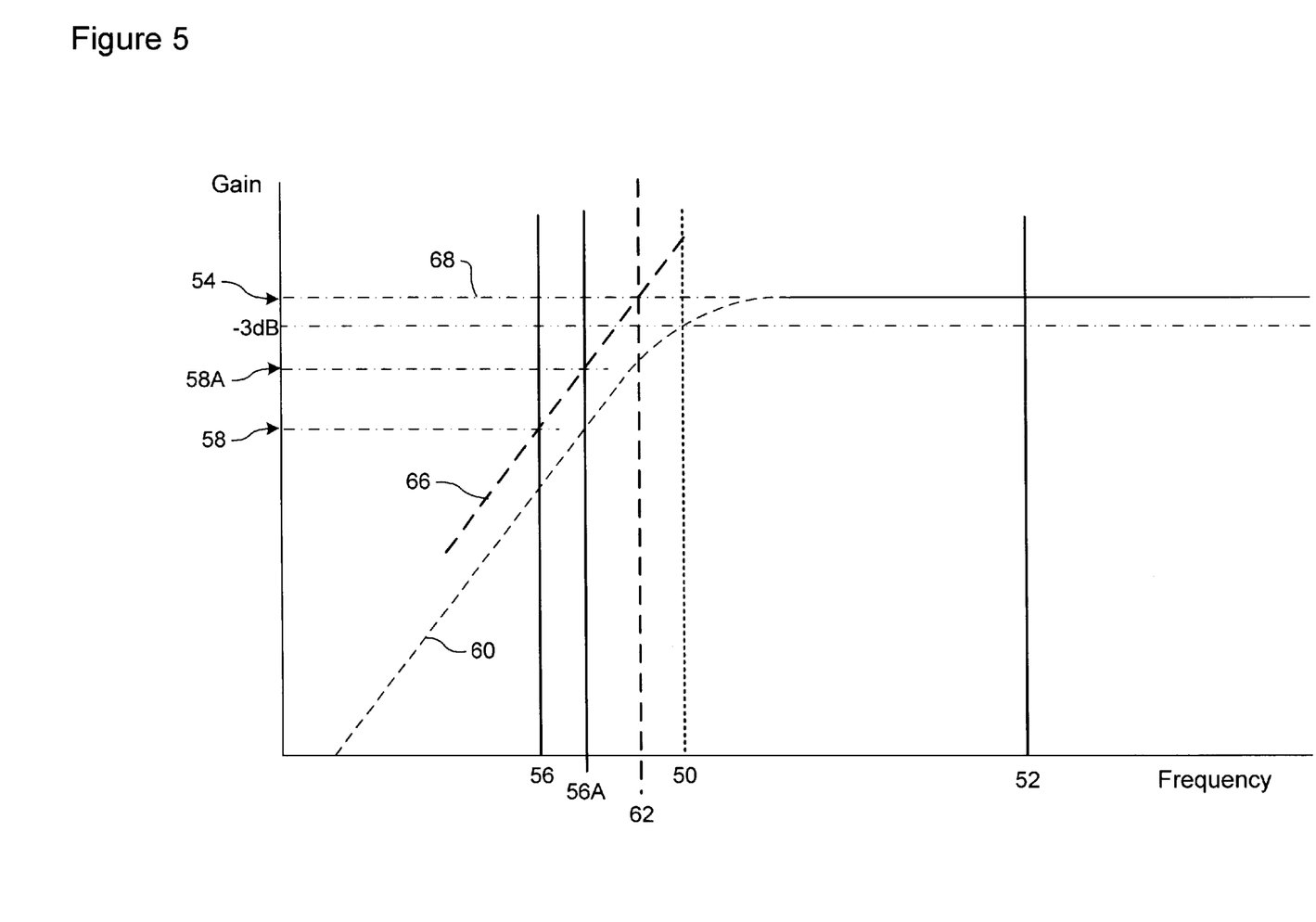
FIG. 5 illustrates a characteristic optical amplifier response curve in relation to probe signals used for tracking dynamic characteristics the amplifier in accordance a second exemplary embodiment of a method of the present invention.

FIG. 5 illustrates another method of estimating the corner frequency, which uses the known slope of an expected characteristic gain curve of the amplifier. This embodiment relies the fact that, in most cases, a changes in the operating conditions of the amplifier causes a movement the characteristic gain curve (and thus a change in the corner frequency), but normally does not significantly affect the slope of the curve below the corner frequency.

The nominal gain of the amplifier is determined using a first predetermined modulation frequency 52, as described above. A second optical probe signal having a second predetermined modulation frequency 56 below the expected corner frequency 50 is used (again, as described above) to determine a second measured gain value 58. This second probing operation is then repeated using a different modulation frequency 56A (which is also below the expected corner frequency), to obtain a second measured gains 58A. The two gains 58 and 58A are then used (in combination with the respective probe frequencies 56 and 56A) to calculate the slope of a line 66, which matches the slope of the characteristic gain curve below the corner frequency. In this case, the corner frequency 62 can be estimated as the frequency at which the line 66 intersects a line 68 representing the gain of the amplifier.

Figure 6:
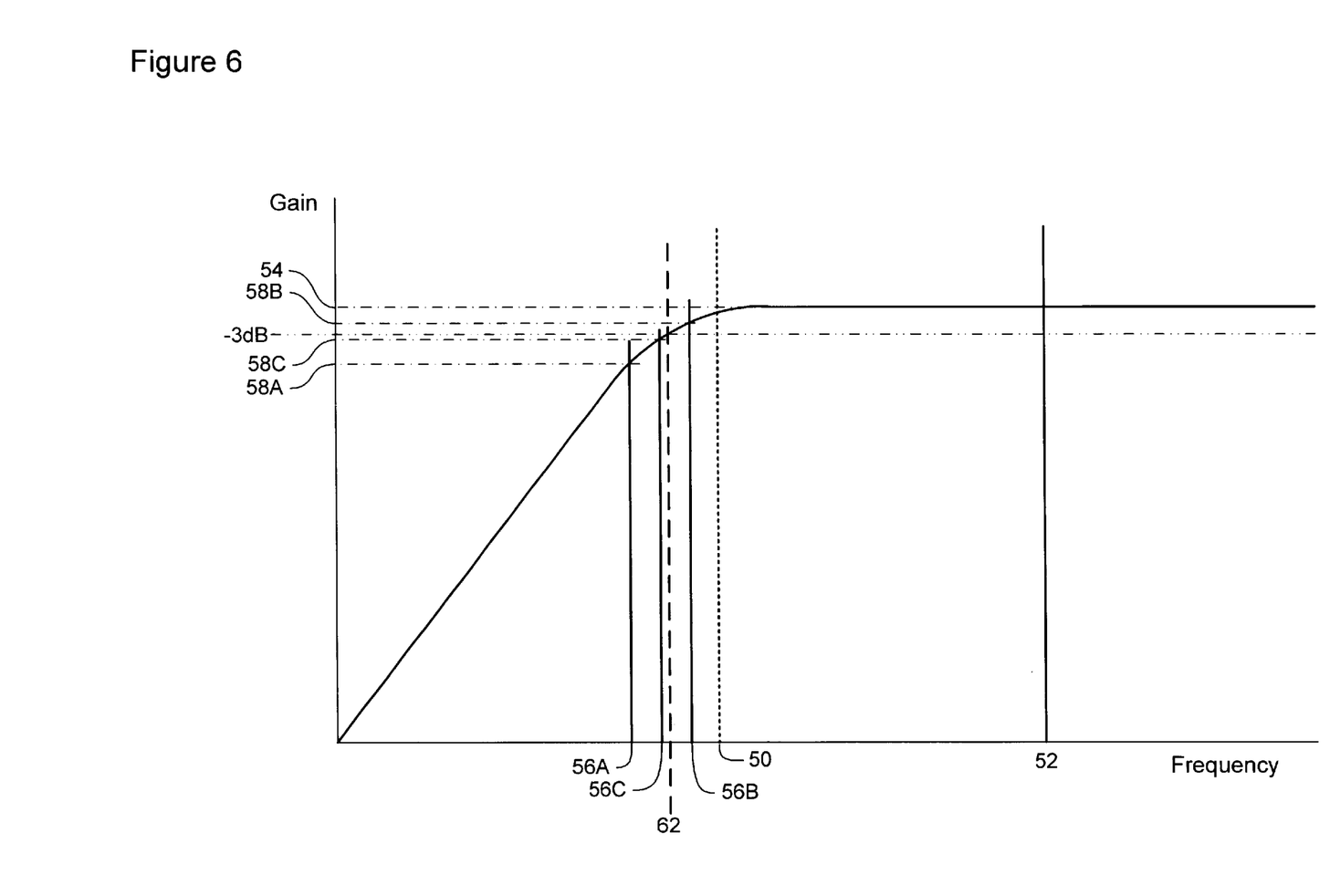
FIG. 6 illustrates a characteristic optical amplifier response curve in relation to probe signals used for tracking dynamic characteristics the amplifier in accordance a third exemplary embodiment of a method of the present invention.

FIG. 6 illustrates another method of estimating the corner frequency, in which multiple probe signals are used to actively "hunt" for the corner frequency. The nominal gain 54 of the amplifier is determined using a first predetermined modulation frequency 52, as described previously. A second optical probe signal having a second predetermined modulation frequency 56 below the expected corner frequency 50 is used (again, as described above) to determine a second measured gain value 58. In this case, however, the second measured gain value 58 is compared with the estimated nominal gain 54 to calculate new modulation frequency in an iterative process that continues until the second measured gain 58 is substantially equal to 3dB below the nominal gain 54 of the amplifier.

Thus, a second optical probe signal having a selected modulation frequency 56A (below the expected corner frequency 50) is used to determine a respective measured gain value 58A. This measured gain 56A is then compared to the nominal gain 54 of the amplifier, where it is determined that the gain 58A is more than 3db below the nominal gain 54. Accordingly, the modulation frequency 56 is increased to calculate a new modulation frequency 56B, and an optical probe signal having the new modulation frequency 56B used to determine a respective measured gain value 58B. This measured gain 56B is then compared to the nominal gain 54 of the amplifier, where it is determined that the gain 58B is less than 3 dB below the nominal gain 54. Accordingly, the modulation frequency 56 is decreased to calculate a new modulation frequency 56C. These steps are repeated iteratively until the second measured gain is substantially equal (that is, within an acceptable error) to 3 dB below the gain of the amplifier. The modulation frequency 56 at which this measured gain 58 is found is then used as the estimated corner frequency 62 of the amplifier.

In the above-described embodiments, a first probe signal having a modulation frequency above the expected corner frequency is used to estimate the nominal amplifier gain. It will be appreciated, however, that many conventional amplifier control systems already measure amplifier gain. Accordingly (particularly in cases where the present invention is being used as a retro-fit to a previously installed amplifier), the gain measured by the amplifier control system can be used in place of the estimated valued based on the first probe signal. This enables the first probe signal to be omitted altogether, so that the gain control monitor 112 can operate "full time" to estimate the corner frequency and determine appropriate control constant values. This scenario is particularly favorable in the embodiment described above with reference to FIG. 6, because the corner frequency can then be tracked, in real-time, to facilitate active optimization of the amplifier control system through continuous adjustments in the amplifier control constants.

The embodiment(s) of the invention described above is(are) intended to be exemplary only. The scope of the invention is therefore intended to be limited solely by the scope of the appended claims.

We claim:

1. A method of tracking dynamic characteristics of an optical amplifier, the method comprising steps of:

estimating a gain of the amplifier using a first optical probe signal having a first predetermined modulation frequency above an expected corner frequency of the amplifier; and estimating a corner frequency of the amplifier using at least one second optical probe signal having a respective second predetermined modulation frequency at or below the expected corner frequency of the amplifier.

2. A method as claimed in claim 1 wherein the step of estimating the gain of the amplifier comprises the steps of:

probing the optical amplifier using the first optical probe signal to determine a first measured gain;

estimating the gain of the amplifier as being equal to the first measured gain.

3. A method as claimed in claim 1 wherein the step of estimating a corner frequency comprises steps of:

probing the optical amplifier using the second optical probe signal to determine a second measured gain;

using the second measured gain and the second predetermined modulation frequency to estimate the corner frequency.

4. A method as claimed in claim 3 wherein the step of estimating the corner frequency comprises the steps of:

matching an expected characteristic gain curve of the amplifier to the second measured gain and the second predetermined modulation frequency; and using the matched curve to estimate the corner frequency.

5. A method as claimed in claim 1 wherein the step of estimating the corner frequency comprises steps of:

probing the optical amplifier using a set of two optical probe signals to obtain corresponding measured gain values at respective different predetermined modulation frequencies;

calculating a slope of an amplifier gain curve using the measured gain values; and using the calculated slope to estimate the corner frequency.

6. A method as claimed in claim 1 wherein the step of estimating the corner frequency comprises steps of:

a) probing the optical amplifier using the second optical probe signal to determine a second measured gain;

b) if the second measured gain is less than 3 dB below the estimated amplifier gain, increasing the second frequency;

c) if the second measured gain is more than 3 dB below the estimated amplifier gain, decreasing the second frequency;

d) repeating steps a) to c) until the second measured gain is substantially equal to 3 dB below the estimated amplifier gain;

e) estimating the corner frequency of the amplifier as equal to the frequency at which the second measured gain is substantially equal to 3 dB below the estimated amplifier gain.

7. A method as claimed in claim 1 wherein the steps of using an optical probe signal comprise steps of:

injecting into an input of the optical amplifier, the optical probe signal having a predetermined input modulation power;

measuring an output modulation power of the optical probe signal at an output of the optical amplifier; and determining a measured gain from a difference between the output and the input modulation powers.

8. A method as claimed in claim 1 wherein the first modulation frequency is approximately 200 kHz and the second modulation frequency is approximately 200 Hz.

9. A method as claimed in claim 1 further comprising steps of:

using the estimated gain of the optical amplifier as a feedback signal to a control loop for controlling the gain of the optical amplifier;

and using the estimated corner frequency to select a control constant in the control loop.

10. A system for tracking dynamic characteristics of an optical amplifier, the system comprising:

gain estimating means for estimating a gain of the amplifier using a first optical probe signal having a first predetermined modulation frequency above an expected corner frequency of the amplifier; and corner frequency estimating means for estimating a corner frequency of the amplifier using a second optical probe signal having a second predetermined modulation frequency at or below the expected corner frequency of the amplifier.

11. A system as claimed in claim 10 wherein gain estimating means comprises:

optical probe source for injecting the optical probe signal having a predetermined input power into an input of the optical amplifier;

measuring means for measuring an output power of the optical probe signal at an output of the optical amplifier; and gain determining means for determining the gain from a difference between the input power and the output power of the probe signal.

12. A system as claimed in claim 11 wherein the optical probe source comprises a modulated broadband light source.

13. A system as claimed in claim 12 wherein the modulated broadband light source comprises a light emitting diode.

14. A system as claimed in claim 12 wherein the means for measuring the output power of the optical probe signal comprises a synchronous detector.

15. An system as claimed in claim 11 wherein the optical probe source comprises a narrowband laser.

* * * * *